United States Patent [19]

Koziel et al.

[11] Patent Number: 4,814,699

[45] Date of Patent: Mar. 21, 1989

[54] METHOD FOR PARTIAL DISCHARGE DETECTION AND BREAKING SPARK MEASURING IN DYNAMO-ELECTRIC HIGH-VOLTAGE MACHINES, AND AN APPARATUS FOR PERFORMING THE METHOD

[75] Inventors: Reinhold Koziel, Mülheim; Kurt Fork, Neunkirchen; Jürgen Weidner, Essen, all of Fed. Rep. of Germany

[73] Assignee: Siemens Aktiengesellschaft, Berlin and Munich, Fed. Rep. of Germany

[21] Appl. No.: 180,087

[22] Filed: Apr. 11, 1988

Related U.S. Application Data

[63] Continuation-in-part of Ser. No. 940,543, Dec. 11, 1986, abandoned.

[30] Foreign Application Priority Data

Dec. 12, 1985 [DE] Fed. Rep. of Germany ....... 3543927

[51] Int. Cl.⁴ ............................................. G01R 31/34
[52] U.S. Cl. ............................ 324/158 MG; 324/511; 324/545; 324/553
[58] Field of Search ................. 324/158 MG, 158 SM, 324/158 SY, 511, 536, 541, 544, 519, 545

[56] References Cited

U.S. PATENT DOCUMENTS 3,896,376  7/1975  Sinniger ..................... 324/158 MG
4,238,733 12/1980  Freeman .................... 324/158 MG
4,577,151  3/1986  Tanisaka et al. ............ 324/158 MG Primary Examiner—Reinhard J. Eisenzopf
Assistant Examiner—Anthony L. Miele
Attorney, Agent, or Firm—Herbert L. Lerner; Laurence A. Greenberg

[57] ABSTRACT

A method for partial discharge detection and breaking spark measurement in a dynamo-electric high-voltage machine, especially for monitoring insulation status during operation of a stator winding and connected electrical output lines in a turbo-generator. The generator includes a stator having a stator winding and a stator housing, a rotor with an exciter winding and a shaft, defining an air gap between the rotor and the stator. At least one oil lubricated slide bearing supports the shaft of the rotor with a bearing shell being electrically insulated from the ground. The method includes decoupling the frequency spectrum of high-frequency electromagnetic oscillations resulting from the occurrence of partial discharges or breaking sparks and delivering the frequency spectrum of high-frequency electromagnetic oscillations to a partial discharge measurement apparatus. The frequency spectrum of high-frequency electromagnetic oscillations introduced into the machine shaft through the air gap in the event of partial discharges inside the stator winding or the output lines are decoupled while utilizing the machine shaft insulated by a film of lubricant as a antenna. Then the frequency spectrum of high-frequency electromagnetic oscillations are delivered to the partial discharge measurement apparatus by using the bearing shell of the oil lubricated slide bearing as transmission element.

9 Claims, 3 Drawing Sheets

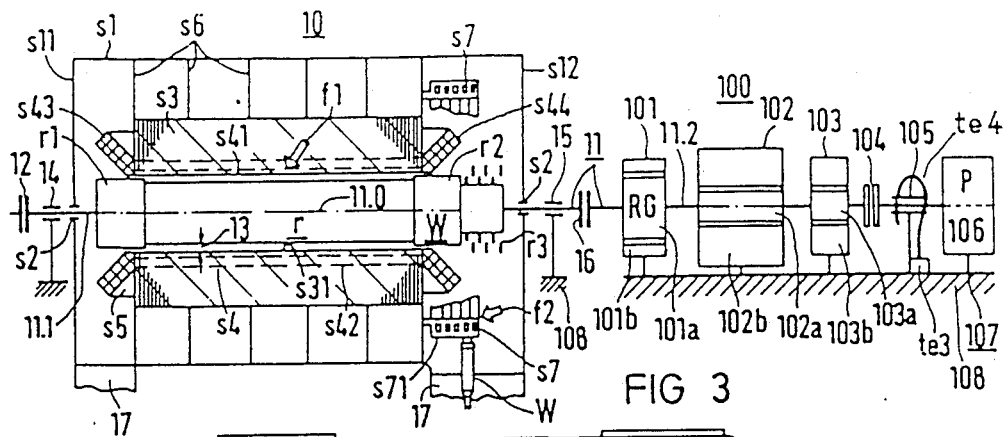
FIG 3
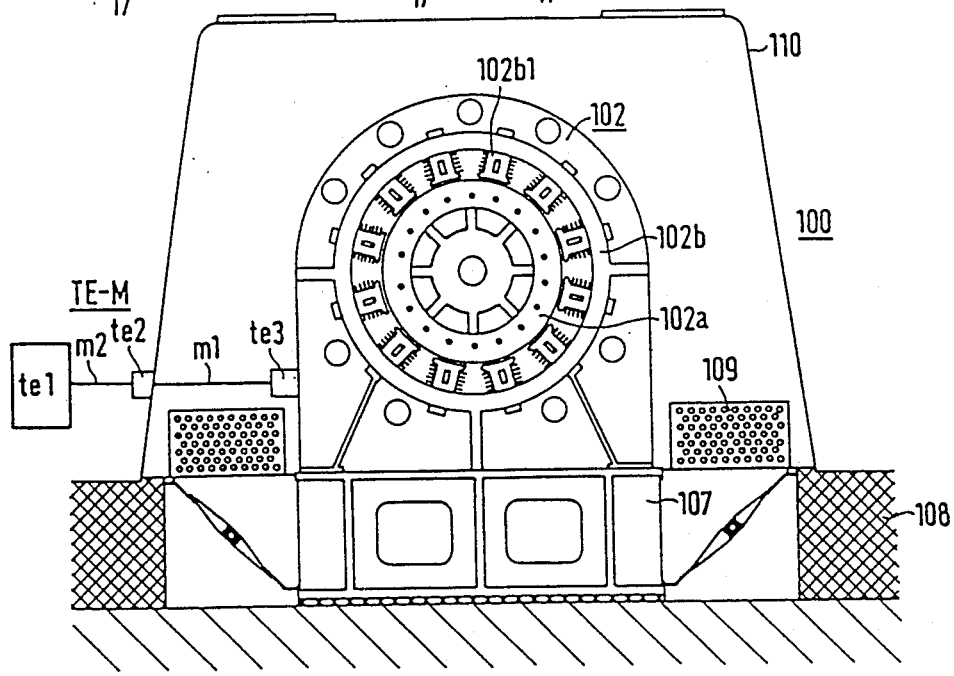
FIG 2
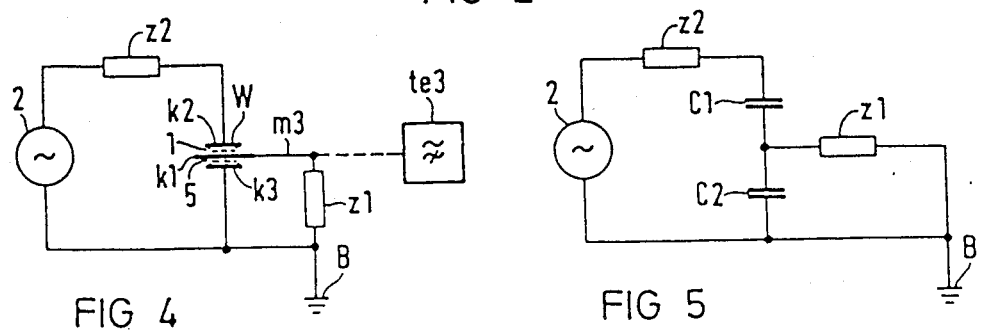
FIG 4
FIG 5

METHOD FOR PARTIAL DISCHARGE DETECTION AND BREAKING SPARK MEASURING IN DYNAMO-ELECTRIC HIGH-VOLTAGE MACHINES, AND AN APPARATUS FOR PERFORMING THE METHOD

This is a continuation-in-part of application Ser. No. 940,543 filed Dec. 11, 1986, now abandoned.

The invention relates to a method for partial discharge detection and breaking spark measurement in dynamo-electric high-voltage machines, in particular for monitoring the status of the insulation during operation of the stator winding and of the electrical output lines connected thereto in turbogenerators, the generator including a stator having a stator winding and a stator housing, a rotor with an exciter winding and a shaft, defining an air gap between the rotor and the stator, and at least one oil lubricated slide bearing supporting the shaft of the rotor; which comprises decoupling the frequency spectrum of high-frequency electromagnetic oscillations resulting from the occurrence of partial discharges or breaking sparks and delivering the frequency spectrum of high-frequency electromagnetic oscillations to a partial discharge measurement apparatus.

The method generically described above can be provided with a coupling unit according to co-pending application Ser. No. 033156. Each such apparatus has one coupling unit including corresponding partial discharge measurement devices that can be selectively coupled to each of the three phase windings of the generator output line, for which purpose the network protection capacitors of each phase are connected through a respective measurement impedance to ground potential, and the shielded measurement lines, which are laid or connected from the measurement voltage connection of the measurement impedance, are guided to the partial discharge measuring instrument of the partial discharge measuring apparatus, through a filter.

This prior art coupling unit has proved itself very well over time; the object of the present invention is to perfect the coupling in order to make it a partial discharge measuring system enabling the attainment of partial discharge measurement signals through a second independent signal route, so that verification and plausibility calculations for the partial discharge measurement signals obtained through the first signal route is facilitated. The present invention is also intended to enable the use of the generic method for partial discharge detection and breaking spark measurement and the corresponding installation of an apparatus for performing the method, without having to take the dynamo-electric high-voltage machine that is to be monitored, in particular a turbine generator, out of operation.

As mentioned above, the invention also relates to an apparatus for performing the generic method, having a partial discharge measuring instrument, and measuring lines connected through coupling filters to the measuring instrument, especially for monitoring the insulation status during operation of the stator winding and the electrical output lines connected thereto in turbogenerators; the turbogenerators including a stator with a stator winding and stator housing and a rotor with an exciter winding and a shaft, as well as an air gap between the rotor and stator, the shaft of the rotor being supported on at least one slide bearing lubricated with oil.

It is accordingly an object of the invention to provide a method of the generic type for partial discharge detection and breaking spark measurement in dynamo-electric, high-voltage machines and an apparatus for performing the method, which overcomes the hereinafore-mentioned disadvantages of the heretofore-known devices of this general type and which perfects the prior art coulping unit in order to provide a partial discharge measuring system.

With the foregoing and other objects in view there is provided, in accordance with the invention, a method for partial discharge detection and breaking spark measurement in a dynamo-electric high-voltage machine, especially for monitoring insulation status during operation of a stator winding and connected electrical output lines in a turbo-generator; the generator including a stator having a stator winding and a stator housing, a rotor with an exciter winding and a shaft, defining an air gap between the rotor and the stator, and at least one oil lubricated slide bearing supporting the shaft of the rotor; which comprises decoupling the frequency spectrum of high-frequency electromagnetic oscillations resulting from the occurrence of partial discharges or breaking sparks and delivering the frequency spectrum of high-frequency electromagnetic oscillations to a partial discharge measurement apparatus; inductively and-/or capacitively decoupling the frequency spectrum of high-frequency electromagnetic oscillations introduced into the machine shaft through the air gap in the event of partial discharges inside the stator winding or the output lines while utilizing the machine shaft insulated by a film of lubricant as an antenna, and then delivering the frequency spectrum of high-frequency electromagnetic oscillations to the partial discharge measurement apparatus. In accordance with another mode of the invention, there is provided a method which comprises delivering the frequency spectrum to the partial discharge measurement apparatus through at least one filter suppressing the low-frequency interference pulses.

In order to carry out the method, there is provided an apparatus for for partial discharge detection and breaking spark measurement in a dynamo-electric high-voltage machine, especially for monitoring insulation status during operation of a stator winding and connected electrical output lines in a turbo-generator including a stator having a stator winding and a stator housing, a rotor with an exciter winding and a shaft with an electromagnetic field, defining an air gap between the rotor and the stator, and at least one oil lubricated slide bearing with a bearing shell electrically insulated from ground potential and the shaft supporting the shaft of the rotor, comprising:

a partial discharge measurement apparatus including at least one partial discharge measuring instrument, coupling filters, measuring lines connected between the coupling filters and the measuring instrument, at least one stationary inductive and/or capacitive coupling loop in the form of a reception antenna coupled to the dipole field of the machine shaft in the immediate vicinity of the bearing shell, the coupling loop having an output side connected to the coupling filters.

In accordance with another feature of the invention, the turbogenerator includes an exciter apparatus, and the inductive coupling loop is disposed in the vicinity of the bearing shell of the bearing of the exciter apparatus.

In accordance with an added feature of the invention, the dynamo-electric high-voltage machine is a turbogenerator having an exciter apparatus with at least one bearing in the axial vicinity of the exciter apparatus supporting the machine shaft and with a shell being insulated with respect to ground, the measuring lines being directly connected through the coupling impedance to a potential point of the bearing shell that is insulated with respect to the shaft and ground.

In accordance with an additional feature of the invention, the bearing of the exciter apparatus includes a bearing shell, and the coupling impedance is connected to the bearing shell.

The advantages attainable through the use of the invention are especially that the apparatus for performing the method according to the invention can be installed and accordingly the method itself can be applied when the dynamo-electric machine, that is, a turbine generator and exciter apparatus, is in operation. This reduces downtime and enables reliable partial discharge monitoring to be performed. If the high-voltage machine must nevertheless be disconnected from the network for inspection or monitoring work, then the entire partial discharge monitoring system can be installed, that is, the coupling unit according to co-pending application Ser. No. 033156, can be installed, which together with the apparatus according to the present invention provides the partial discharge monitoring system. A further substantial advantage is that the inductive and-/or capacitive coupling to the shaft, which may be considered as an elongated or flat in-line dipole or multipole, is conveniently attainable. The portion of the shaft belonging to the high-voltage machine itself is not the sole portion that can be used. Instead, coupling can be performed outside that portion of the machine, in the vicinity of the exciter apparatus, and in this case coupling in the vicinity of the bearing shell is attained by using the shell as a transmitter is particularly recommended.

Other features which are considered as characteristic for the invention are set forth in the appended claims.

Although the invention is illustrated and described herein as embodied in method for partial discharge detection and breaking spark measurement in dynamo-electric high-voltage machines, and apparatus for performing the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 2 is a cross-sectional view taken along the line II—II of FIG. 1, in the direction of the arrows;

FIG. 3 is a fragmentary, front-elevational view of the dynamo-electric high-voltage machine in the form of a turbogenerator, to be monitored in terms of partial discharges, along with the exciter apparatus belonging thereto;

FIG. 4 is a highly schematic equivalent circuit diagram of a device for capacitive decoupling of partial discharge measurement signals from a shaft bearing;

FIG. 5 is another equivalent circuit diagram similar to that shown in FIG. 4;

Figure 6:
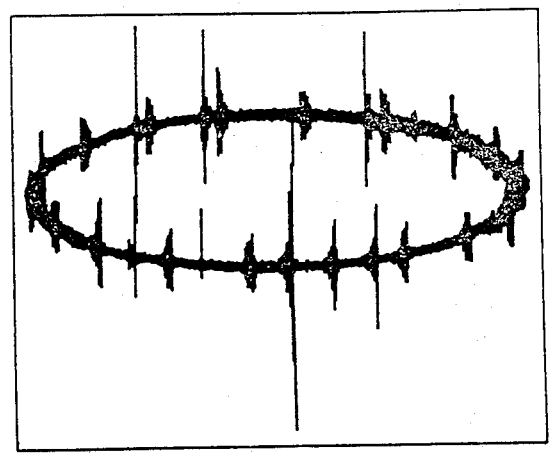
Figure 7:
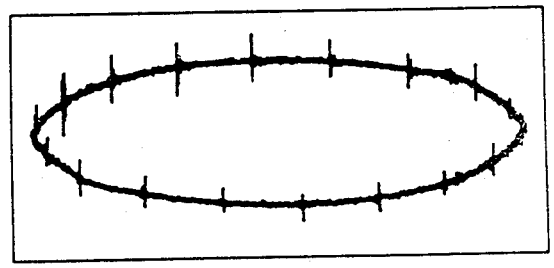

FIG. 6 is an illustration of a 50 Hz fundamental or basic wave of the stator winding phases of the turbogenerator to be monitored, which is shown on an elliptical time axis with a two-beam oscillograph, with the pronounced basic interference level shown, upon which relatively high breaking spark pulses are superimposed; and FIG. 7 is an illustration similar to FIG. 6 showin a diagram of the partial discharge relationships in the phases of the generator stator winding considered to respond without interference, wherein the fine peaks are dictated by switching events, which are brought about by the diodes of a rotating rectifier wheel.

Figure 1:
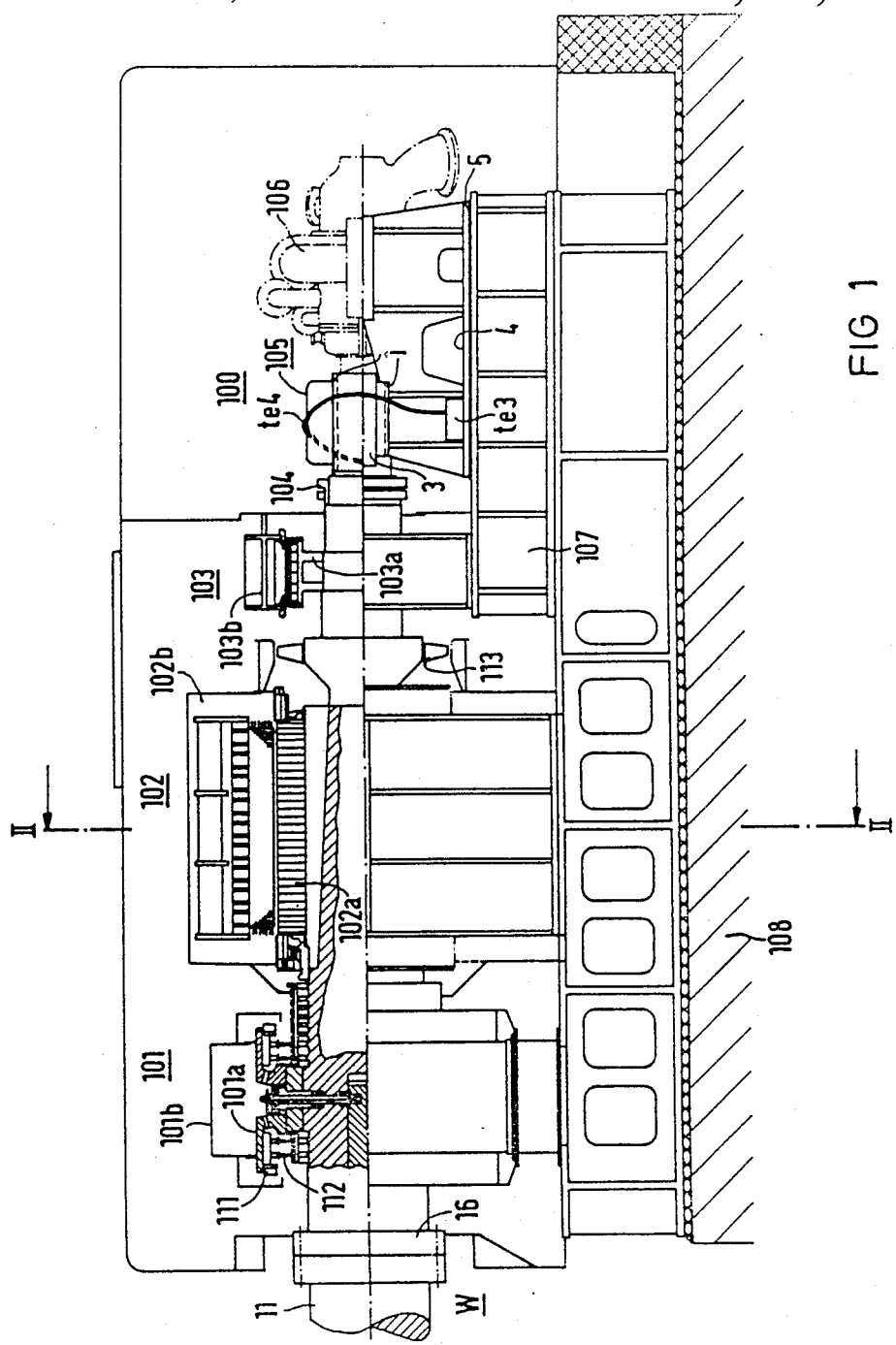
FIG. 1 is a fragmentary, diagrammatic, front-elevational view, partially broken-away in a longitudinal section, of an the exciter apparatus of a turbogenerator.

Referring now to the FIGS. of the drawings in detail and first, particularly, to FIGS. 1–3 thereof, there is seen a turbogenerator 10 having an exciter apparatus 100. The shaft of a non-illustrated drive turbine should be assumed to be coupled to a common shaft 11 by a shaft coupling 12 at the left-hand end of the FIG. The drive turbine may be a steam or gas turbine. The following discussion will refer first to the overall diagrammatic view of FIG. 3.

A rotor r, which is provided with a non-illustrated field or exciter winding, forms part of the shaft 11; on both ends, it is provided with a respective coil or winding end cap or end bell r1, r2. A multi-stage axial compressor r3 is also shown on the right-hand end of the rotor r, which recirculates a cooling gas such as H (although in smaller machines, air is used) for cooling in the interior of the machine; the machine interior is defined with respect to the outside by a housing shell or jacket s1, and sealing shaft bushing or lead-throughs are indicated at reference symbol s2 in the vicinity of housing end walls s11, s12. The rotor r is surrounded by a stator lamination bundle or stack s3 of a stator s6 and is spaced apart therefrom by an annular gap 13, generally known as a air gap. Stator winding rods s4 are inserted at the periphery of a stator lamination bundle bore s31, in suitable longitudinal grooves formed in the stator lamination bundle s3 and distributed over the periphery thereof. Typically, the rods s4 inside a given groove are in the form of an upper rod s41 and a lower rod s42. In the vicinity of two end windings s43, s44, the stator winding rods are electrically connected to one another to form a three-phase rotary current winding; the end windings s43, s44 are fixed against current forces by means of end winding retainers s5 which are not shown in detail, although a thermally dictated change in length of the stator winding rods s4 is nevertheless permitted. The stator lamination bundle s3 is held centrally with respect to the shaft 11 or the axial center line 11.0 thereof in the frame construction of the stator s6. Ring circuits or loops s7 which are shown in fragmentary form are secured to the stator s6 with suitable annular clamping elements s71. The ring circuits s7 provide electrical circuitry for the stator winding in such a way that by interconnecting the lap windings or two-circuit windings of the upper and lower rods s4 of the stator winding, three phase output lines U, V and W can be extended out of the machine in an insulated manner, the lead-through for the phase W being shown in FIG. 3.

The portion of the shaft 11 shown is supported on both ends of the generator 10 on journal-type radial bearings 14, 15; a further shaft coupling 16 is interposed between a portion 11.1 of the shaft belonging to the generator 10 and a portion 11.2 of the shaft belonging to the exciter apparatus 100.

The exciter apparatus 100 of the turbogenerator 10 has a so-called RG or rectifier set 101, a main exciter or dynamo 102, a pilot or auxiliary exciter or dynamo 103, a measuring slip-ring device 104, an exciter bearing 105, and a shaft pump 106, if the stator winding having the rods s4 and optionally a non-illustrated rotor winding are water-cooled. The cooling fluid is directed from the shaft pump 106 through the hollow shaft into the interior of the stator housing s1 and returned through suitable return conduits to the pump.

The rectifier set 101 includes a rectifier carrier wheel 101a which revolves along with the shaft 11, and a housing 101b. The main exciter 102 includes an armature 102a revolving with the shaft and a stator 102b having external poles with field windings which are not illustrated in FIG. 3, since it is an external pole exciter. The individual field windings of the external poles of the main exciter are supplied with the exciter current from the stationary armature 103b of the auxiliary exciter 103, which has a permanent pole rotor 103a rotating with the shaft, for exciting the armature winding. The electrical connecting lines between the components 101. 102 and 103 are not shown in FIG. 3. The electrical connecting lines also include rotary current supply lines, which extend from the rotating armature 102a of the main exciter 102 to the individual diodes of the rectifier carrier wheel 101a; these diodes are in particular connected in a three-phase bridge circuit and on their direct current output side they furnish the direct exciter current to the field winding of the rotor r through exciter supply lines disposed in the shaft 11.

The stationary parts of the components 101, 102, 103, 105 and 106 are supported on a supporting frame 107, which stands on a foundation 108 diagrammatically indicated by broken lines. A further supporting structure standing on the foundaton for the stator s6 of the turbogenerator 10, is shown in part at reference numeral 17.

The components of the exciter apparatus 100 explained above in conjunction with FIG. 3 are identified in FIGS. 1 and 2 by the same reference numerals; in addition, the following details are also seen: a coolor 109, constructed as a coil-type heat exchanger for the cooling gas, in particular cooling air, circulating inside a housing shell or jacket 110 of the exciter apparatus 100; magnetic poles 102b1 of the main exciter 102; electrical safety fuses 111 for diodes 112 of the rectifier carrier wheel 101a; and an axial fan 113 on one end of the main exciter 102. The housing 101b of the rectifier set 101 does not have any supporting functions; instead, it serves as an air guidance hood.

The method for partial discharge detection and breaking spark measurement in dynamo-electric high-voltage machines or generators according to the invention can be carried out with the partial discharge measurement apparatus described below. A preferred embodiment thereof relates to the above-described turbogenerator having an output range between approximately 50 MVA and 1400 MVA, which has a smooth-core rotor. The method is thus also suitable for monitoring other synchronized machines, such as hydraulic power generators which have rotors with well-defined poles, or other high-voltage generators in which it is important to monitor the status of the stator winding insulation during operation and that of the ring circuits or other circuit lines. The measuring apparatus according to the invention makes use of the fact that the shaft 11, with its partial shafts 11.1 and 11.2 rotates inside its sliding bearings 14, 15, 105 in an oil film 1, which is indicated by broken lines for the shaft or exciter bearing 105 in FIG. 1. Thus the shaft 11 represents a first approximation of a flat or elongated in-line dipole. If partial discharges occur at any point within the stator winding having the rods s4, as indicated by an arrow f1, then these partial discharges, which extend from a voltage-carrying stator winding rod through the non-illustrated rod insulation thereof, to the stator iron or core or to a neighboring rod, have the effect of generating a wide-band frequency spectrum of high-frequency oscillations, which is introduced into the rotor r and thus into the shaft 11 through the air gap 13, substantially by means of capacitive coupling. This capacitive transmission causes the copper winding of the particular stator winding rod to act as a capacitive backing, coating or foil, and the rod insulation and the air gap may be considered as the dielectric of a large capacitor, the other backing, foil or coating of which is the metal mass of the rotor r and of the shaft 11. Naturally, an inductive transmission of the frequency spectrum to the unit formed of the rotor and shaft 11 (simply referred to as the shaft W below) also takes place, but to a lesser extent. The introduction of a wide-band frequency spectrum of high frequency electromagnetic oscillations logically also takes place, for instance, if partial discharges arise at one of the ring circuits, as indicated by an arrow f2. However, in this case due to the substantially greater radial spacing of the ring circuits (which may also include a grounding line), the capacitively introduced portion is smaller and the inductively introduced portion is larger. The substantial factor is that a distinction must be made between harmless partial discharge events and those which may cause damage to the winding insulation over the long run. It is understood that breaking sparks, which are nothing more than particularly large partial discharges, must be recognized immediately and unequivocally.

The overall partial discharge measurement apparatus is indicated by reference symbol TE-M in FIG. 2. The apparatus includes at least one partial discharge measuring instrument te1, which is diagrammatically illustrated as a box, measuring lines m1, m2, especially in the form of coaxial cables, a high-frequency plug socket te2 in the form of a measurement connection leading to the measuring instrument te1, and a coupling filter te3 which is secured, for instance, to the housing shell or jacket 102b of the main exciter 102. A first portion m1 of the measuring lines is extended from the coupling filter to the high-frequency socket te2 and the second portion m2 of the measruing line leads from there to the measuring instrument te1. The measuring line portion m2 is in particular a flexible coaxial cable of sufficient length to permit the measuring instrument te1 to be installed at a measurement location remote from the exciter apparatus 100.

The coupling filter te3 is illustrated in its axial position in FIG. 3 and in even more detail in FIG. 1. One end of an inductive coupling loop te4 is electrically connected to the input side of the filter and the other end of the coupling loop te4 is wrapped around the housing of the exciter bearing 105. In a test version, the inductive coupling loop is formed of an insulated copper wire having a cross-section of 2.5 mm$^2$ and a length of approximately 2.5 m. The coupling loop therefore serves as a reception antenna, which is connected to the dipole field of the machine shaft W and is connected at its output side to the measuring line m1 which is not shown in FIGS. 1 and 3, preferably through the coupling filter te3. The advantage of an inductive coupling loop of this kind is its mobility: it can initially be experimentally positioned at various locations on the shaft W inside the exciter apparatus 100 and the location vector encompassed by the loop can also be changed by rotating the loop until such time as the greatest useful signal is received. In addition to the embodiment of the invention in which an inductive and/or capacitive coupling is provided by means of a coupling loop, according to a second embodiment of the invention, in order to obtain partial discharge measurement signals on a second measurement route through a coupling impedance z1 seen in FIG. 4, a measuring line m3 can be connected by a galvanic connection to a capacitance pole k1, which is in the form of the bearing shell that is insulated with respect to the shaft W and with respect to ground potential B of the shaft bearing 105 of the machine or generator. According to a third embodiment of the invention, both of these methods are combined. In FIG. 4, reference numeral 2 indicates a high-frequency generator (abbreviated as HF generator), having an impedance z2 as an internal resistor. The HF generator 2 with its impedance z2 provides a simplified equivalent circuit diagram for the electromagnetic waves transmitted from the location of a partial discharge and introduced through the air gap 13 shown in FIG. 3 through capacitive coupling into the shaft W. The shaft W thus forms one pole k2 of the capacitance, and the oil film 1 seen in FIG. 1 acts as a dielectric between the shaft W (coating k2) and the opposite capacitance pole k1 is provided by the bearing shell. The bearing shell, which in FIG. 1 is covered by a bearing housing 3, is connected with the bearing housing to the same potential, and the bearing housing 3 is supported by supports 3.1 thereof and a base plate 4 on the supporting frame 107, with an insulating layer 5 disposed therebetween. The supporting frame 107 is part of the foundation 108, or is metallically connected thereto, and accordingly is connected to ground potential. If the potential conditions at the exciter bearing 105 are applied to the equivalent circuit diagram of FIG. 4, then the lower capacitance k3 represents the supporting frame 107 connected to ground potential, and the dielectric between the coatings k1 and k3 is formed by the insulating layer 5. The equivalent capacity C having the poles k1, k2 and k3 is shown in the circuit diagram of FIG. 5 as a series circuit formed of two parallel capacitances C1 and C2, and the coupling or measuring impedance z1 should be thought of as being connected to the connecting line of two partial capacitances C1, C2. The coupling filter te3 would then be connected to the end of the measuring impedance z1 facing away from from ground potential B, as indicated in FIG. 4; the remaining configuration of the measuring lines m1, m2 of the measuring instrument te1 and of the socket te2 could be retained.

In logical comparison with the equivalent circuit diagram of FIG. 5, a corresponding equivalent circuit diagram could be provided for the inductive decoupling, as is shown schematically in FIG. 1.

Due to the above-described decoupling of the partial discharge measurement signals from the electromagnetic field of the shaft W, either inductively or capacitively or both, a very reliable measurement apparatus is obtained, because the measurement signals obtained capacitively can be controlled and verified and vice versa, by means of the inductively obtained signals. By using both methods, the choice is therefore available of selecting a particular method for evaluation that provides a larger measurement signal in a given case.

A further description of the partial discharge measurement apparatus TE-M is unnecessary in the context of the present application, because it is described in greater detail in co-pending application Ser. No. 033,156, filed Feb. 13, 1987. That application is hereby incorporated by reference, to avoid repetition. Furthermore, in the context of the structure and mode of operation of partial discharge measurement apparatus, the article entitled "Wicklungsüberwachung von elektrischen Maschinen durch Hochfrequenz-Messverfahren" [Winding Monitoring Using High-Frequency Measurement Methods] by P. Grünewald, J. Weidner and A. Wichmann, is also cited; this article is printed in the journal "Siemens-Energietechnik" [Siemens Energy Technology] 6 (1984), pages 286–289. Basic discussion of partial discharge measurements in high-voltage transformers as a means for quality control are provided in a technical article by H. Nieschwietz and W. Stein in the journal "Elektrotechnischen Zeitschrift etz-a" [Electrical Engineering Journal; abbreviated as etz-a], Vol. 97 (1976), No. 11, pages 657–663.

Finally, the two diagrams of FIGS. 6 and 7 will be explained. The measurements performed with an inductive coupling loop te4 according to FIG. 1 pertaining to a normal insulation status of the stator winding of a turbine generator including its generator output lines, resulted in a diagram shown in FIG. 7. A two-beam oscillograph has formed an image of eighteen partial discharge peaks superimposed with the 50 Hz fundamental wave shown on an elliptical timing axis, which are the result of switching events of the rectifier diodes, which are revolving around the rectifier set 101 seen in FIG. 3 and connected in a three-phase bridge circuit. These relatively small partial discharge peaks may be considered normal or harmless; whereas the partial discharge peaks of substantially greater amplitude shown in FIG. 6 are due to pulses brought about by a grounding line breakage of a generator switching line. Based on this diagram, rapid recognition, location and correction of the malfunction that was at fault was possible.

We claim:

1. Method for partial discharge detection and breaking spark measurement in a dynamo-electric high-voltage machine, especially for monitoring insulation status during operation of a stator winding and connected electrical output lines in a turbo-generator;

the generator including a stator having a stator winding and a stator housing, a rotor with an exciter winding and a shaft, defining an air gap between the rotor and the stator, and at least one oil lubricated slide bearing supporting the shaft of the rotor with a bearing shell being electrically insulated from the ground;

which comprises decoupling the frequency spectrum of high-frequency electromagnetic oscillations resulting from the occurrence of partial discharges or breaking sparks and delivering the frequency spectrum of high-frequency electromagnetic oscillations to a partial discharge measurement apparatus;

decoupling the frequency spectrum of high-frequency electromagnetic oscillations introduced into the machine shaft through the air gap in the event of partial discharges inside the stator winding or the output lines while utilizing the machine shaft insulated by a film or lubricant as an antenna, and then delivering the frequency spectrum of high-frequency electromagnetic oscillations to the partial discharge measurement apparatus by using the bearing shell of said oil lubricated slide bearing as a transmission element.

2. Method according to claim 1, which comprises decoupling the frequency spectrum of high-frequency electromagnetic oscillations inductively and capacitively.

3. Method according to claim 1, which comprises decoupling the frequency spectrum of high-frequency electromagnetic oscillations inductively.

4. Method according to claim 1, which comprises decoupling the frequency spectrum of high-frequency electromagnetic oscillations capacitively.

5. Method according to claim 1, delivering the frequency spectrum to the partial discharge measurement apparatus through at least one filter suppressing the low-frequency interference pulses.

6. Apparatus for for partial discharge detection and breaking spark measurement in a dynamo-electric high-voltage machine, especially for monitoring insulation status during operation of a stator winding and connected electrical output lines in a turbo-generator including a stator having a stator winding and a stator housing, a rotor with an exciter winding and a shaft with an electromagnetic field, defining an air gap between the rotor and the stator, and at least one oil lubricated slide bearing supporting the shaft of the rotor with a bearing shell being electrically insulated from the ground, comprising:

a partial discharge measurement apparatus including at least one partial discharge measuring instrument, coupling filters, measuring lines connected between said coupling filters and said measuring instrument, at least one stationary coupling loop in the form of a reception antenna coupled over the bearing shell to the electromagnetic field of the machine shaft in the immediate vicinity of the bearing shell, said coupling loop having an output side connected to said coupling filters.

7. Apparatus for partial discharge detection and breaking spark measurement in a dynamo-electric high-voltage machine, especially for monitoring insulation status during operation of a stator winding and connected electrical output lines in a turbo-generator including a stator having a stator winding and a stator housing exciter apparatus including, a rotor with an exciter winding and a shaft, defining an air gap between the rotor and the stator, and at least one oil-lubricated slide bearing supporting the shaft of the rotor having a bearing shell in axial proximity of said exciter apparatus, being electrically insulated from ground potential comprising: a partial discharge measurement apparatus including coupling filters, measuring lines connected to said coupling filters, a first capacitance formed between said bearing shell and said shaft, and a second capacitance being formed between said bearing shell and ground, said measuring lines being directly connected through a coupling impedance to potential point of bearing shell that is essentially insulated with respect to the shaft and forms said second capacitance with ground and said first capacitance with the shaft.

8. Apparatus according to claim 7, wherein said coupling impedance is an inductive coupling loop disposed in the vicinity of the bearing shell of the bearing of the exciter apparatus.

9. Apparatus according to claim 8, wherein the at least one bearing is disposed in axial vicinity of the exciter apparatus for supporting the machine shaft.

* * * * *